(12) United States Patent
MacDonald

(10) Patent No.: US 10,133,835 B1
(45) Date of Patent: Nov. 20, 2018

(54) SYSTEM AND METHOD FOR COMPUTATIONALLY OPTIMIZED CHARACTERIZATION OF COMPLEX LOGIC CELLS

(71) Applicant: CADENCE DESIGN SYSTEMS, INC., San Jose, CA (US)

(72) Inventor: Robert MacDonald, Austin, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 1142 days.

(21) Appl. No.: 14/099,817

(22) Filed: Dec. 6, 2013

(51) Int. Cl.
*G06F 17/50* (2006.01)

(52) U.S. Cl.
CPC ................. *G06F 17/5022* (2013.01)

(58) Field of Classification Search
None
See application file for complete search history.

(56) References Cited

U.S. PATENT DOCUMENTS

| 6,499,129 | B1 * | 12/2002 | Srinivasan | G06F 17/5022 703/13 |
| 7,000,202 | B1 * | 2/2006 | Srinivasan | G01R 31/318357 716/106 |
| 7,937,256 | B2 | 5/2011 | Tseng et al. | |
| 8,160,858 | B2 | 4/2012 | Tseng et al. | |
| 8,543,954 | B1 * | 9/2013 | Keller | G06F 17/5031 703/14 |

* cited by examiner

*Primary Examiner* — Omar F Fernandez Rivas
*Assistant Examiner* — Herng-Der Day
(74) *Attorney, Agent, or Firm* — Rosenberg, Klein & Lee

(57) ABSTRACT

A system and method are provided for reducing processing time in characterizing a programmably implemented cell. The cell is decomposed into a plurality of channel connected component portions (CCC's), each including a local output node and at least one switching device establishing a conduction channel within a channel path extending from the local output node to a power plane of the cell. A component characteristic function is generated for each CCC, which logically sums a locus of vectors for nodes electrically connected to the local output node. Each CCC's component characteristic function is expanded to form a local characteristic function relative to one or more other upstream CCC. Each local characteristic function is thereby formed exclusive of any upstream local output node electrically disconnected from its local output node. At least one feasible vector is selectively generated from the local characteristic functions according to requirements predefined for a parametric measurement.

20 Claims, 12 Drawing Sheets

| Cell | Without Computational Optimization | | With Computational Optimization | |
|---|---|---|---|---|
| | Vectors | Time | Vectors | Time |
| SDFT1 | 76 | 4s | 35 | 4s |
| SDFT3 | 422 | 53s | 54 | 5s |
| SDFT6 | 1948 | 410s | 85 | 13s |
| SDFT12 | 2751 | 2125s | 145 | 54s |

Fig. 10

| Cell | Without Computational Optimization | | | With Computational Optimization | | |
|---|---|---|---|---|---|---|
| | Vectors | Spice CPU Hours | Total CPU Hours | Vectors | Spice CPU Hours | Total CPU Hours |
| SDFT1 | 76 | 0.07 | 0.08 | 35 | 0.06 | 0.07 |
| SDFT3 | 422 | 0.21 | 1.08 | 54 | 0.13 | 0.18 |
| SDFT6 | 1948 | 0.78 | 8.98 | 85 | 0.32 | 0.44 |
| SDFT12 | 2751 | 1.27 | 36.57 | 145 | 0.97 | 1.34 |

Fig. 11

| Cell | Without Computational Optimization | | | With Computational Optimization | | | |
| --- | --- | --- | --- | --- | --- | --- | --- |
| | Vectors | CPU Time | Total Number of SPICE Simulations | Circuit Simulator CPU Time | Vectors | CPU Time | Total Number of SPICE Simulations | Circuit Simulator CPU Time |
| SDFT1 | 98 | 214s | 380 | 166s | 98 | 197s | 380 | 150s |
| SDFT3 | 414 | 3068s | 967 | 522s | 57 | 505s | 472 | 351s |
| SDFT6 | 18602 | >43200s | | | 87 | 1225s | 707 | 828s |
| SDFT12 | N/C | | | | 147 | 3949s | 1191 | 2598s |

Fig. 12A

| Cell | Without Computational Optimization | | With Computational Optimization | |
| --- | --- | --- | --- | --- |
| | Vectors | CPU Time | Vectors | CPU Time |
| SDFT32 | N/C | >147600s | 347 | 1319s |

Fig. 12B

SYSTEM AND METHOD FOR COMPUTATIONALLY OPTIMIZED CHARACTERIZATION OF COMPLEX LOGIC CELLS

BACKGROUND OF THE INVENTION

The subject system and method are generally directed to computationally optimizing the characterization process for a logic cell modeling an electronic circuit. More specifically, the subject system and method reduce the processing load, hence the processing time, for characterizing such a logic cell. The system and method provide measures for simplifying the logical representation of nodes within even complex logic cells having multiple logic components in such manner that only electrically relevant nodes are maintained in the representation. This makes for streamlined logical representations of logic cells and obviates extraneous analyses in the mapping of relevant nodes to their appropriate logic levels during a cell characterization process.

Cell characterization processes are known in the art. U.S. Pat. Nos. 8,160,858 and 7,937,256 provide an example. During cell characterization, electrical and logical behavior is extracted from transistor level circuits for logic gate cells into abstract models of timing, power, noise, and logic function. Such cell characterization processes are notoriously computation-intensive and tend to be prohibitively so for cells of some complexity. While various measures have been employed in the art to enhance efficiency, significant inefficiencies remain in cell characterization processes heretofore known.

SUMMARY OF THE INVENTION

It is an object of the present invention to provide a system and method which enhance efficiency in cell characterization processes.

It is another object of the present invention to provide a system and method which enable logical expansion in a cell characterization process to be carried out in computationally manageable manner even for complex logic cells.

It is yet another object of the present invention to provide a system and method for simple and efficient characterization of even complex logic cells containing multiple logic components.

These and other objects are attained in a system for computationally optimized characterization of a programmably implemented cell that models an electronic circuit having multiple logic components, each of which is defined by a plurality of switching devices and interconnection nodes. The system comprises a grouping module which executes to decompose the cell into a plurality of channel connected component (CCC) portions intercoupled along a downstream flow direction between input and output nodes of the cell. Each CCC portion includes a local output node defined by one of the nodes of the cell and at least one switching device that establishes a conduction channel within a channel path extending from the local output node to a power plane of the cell. A function generation module is coupled to the grouping module. The function generation module executes to generate a component characteristic function for each CCC portion, which component characteristic function logically sums a locus of vectors for nodes electrically connected to the local output node. The vectors each map the nodes within one channel path of the CCC portion to one potential combination of logic values therefor. A function expansion module executes to expand the component characteristic function of each CCC portion to form a local characteristic function with respect to one or more other CCC portions disposed upstream therefrom. The function expansion module selectively combines with the component characteristic function of the upstream CCC portion each vector of the CCC portion containing the local output node of the upstream CCC portion, such that the local characteristic function excludes any upstream local output node electrically disconnected from the local output node thereof. A vector determination module executes on the local characteristic functions to generate at least one feasible vector according to requirements predefined for a parametric measurement. Each feasible vector defines a combination of interrelated node logic levels permitting simulated analysis of the parametric measurement.

A system implemented in accordance with certain embodiments of the present invention provides for reducing processing time in characterizing a programmably implemented cell that models an electronic circuit having multiple logic components each defined by a plurality of switching devices and interconnection nodes. The system comprises a grouping module executing to decompose the cell into a plurality of CCC portions intercoupled along a downstream flow direction between input and output nodes of the cell. Each CCC portion includes a local output node defined by one of the nodes of the cell, where the local output node is connected to one of: a control terminal of a switching device in a downstream CCC portion and the output terminal of the cell. Each CCC portion also includes at least one switching device establishing a conduction channel within a channel path extending from the local output node to a power plane of the cell. A function generation module coupled to the grouping module executes to generate a component characteristic function for each CCC portion. The component characteristic function combines by a logical OR a locus of all vectors for nodes electrically connected to the local output node. The vectors each map the nodes within one channel path of the CCC portion to one potential set of logic values therefor combined by a logical AND. A function expansion module executes to iteratively expand the component characteristic function of each CCC portion in turn with respect to each successively upstream CCC portion having a local output node represented in at least one vector of the CCC portion. Each vector of the CCC portion containing the local output node of the upstream CCC portion is selectively combined with the component characteristic function of the upstream CCC portion. The function expansion module thereby forms for each CCC portion a local characteristic function precluding any extraneous vector containing an upstream local output node electrically disconnected from the local output node thereof. A vector determination module executes on the local characteristic functions to generate a plurality of feasible vectors according to requirements predefined for a parametric measurement. The feasible vectors collectively define all combinations of interrelated node logic levels permitting simulated analysis of the parametric measurement.

A method implemented in accordance with certain embodiments of the present invention provides for reducing processing time in characterizing a programmably implemented cell that models an electronic circuit having multiple logic components each defined by a plurality of switching devices and interconnection nodes. The method executes in at least one processor, and comprises decomposing the cell into a plurality of CCC portions intercoupled along a downstream flow direction between input and output nodes of the cell. Each CCC portion includes a local output node defined by one of the nodes of the cell and at least one switching device establishing a conduction channel within a channel path extending from the local output node to a power plane of the cell. A component characteristic function is generated for each CCC portion, which component characteristic function logically sums a locus of vectors for nodes electrically connected to the local output node. The vectors each map the nodes within one channel path of a CCC portion to one potential combination of logic values therefor. The component characteristic function of each CCC portion is expanded to form a local characteristic function with respect to one or more other CCC portions disposed upstream therefrom. The function expansion includes selectively combining with the component characteristic function of the upstream CCC portion each vector of the CCC portion containing the local output node of the upstream CCC portion. The local characteristic function thereby excludes any upstream local output node electrically disconnected from the local output node thereof. At least one feasible vector is selectively generated from the local characteristic functions according to requirements predefined for a parametric measurement. Each feasible vector defines a combination of interrelated node logic levels permitting simulated analysis of the parametric measurement.

BRIEF DESCRIPTION OF THE DRAWINGS

FIG. 10 is a table of comparative test results obtained from test runs alternatively made on different-sized configurations of the logic cell of FIG. 9, with and without activation of the embodiment of the present invention shown in FIG. 6;

FIG. 11 is another table of comparative test results obtained from test runs alternatively made on different-sized configurations of the logic cell of FIG. 9, with and without activation of the embodiment of the present invention shown in FIG. 6;

FIG. 12A is another table of comparative test results obtained from test runs alternatively made on different-sized configurations of the logic cell of FIG. 9, with and without activation of the embodiment of the present invention shown in FIG. 6, additionally showing required simulation processing loads; and, FIG. 12B is still another table of comparative test results obtained from test runs alternatively made on a 32-bit configuration of the logic cell of FIG. 9, with and without activation of the embodiment of the present invention shown in FIG. 6.

DESCRIPTION OF THE PREFERRED EMBODIMENTS

Figure 1:
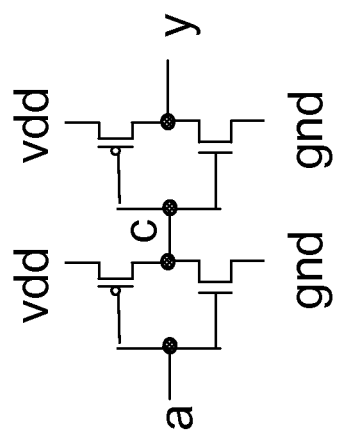
FIG. 1 is a schematic diagram illustrating an example of a device-level circuit for NAND gate logic cell.

As used herein, the term vector refers generally to a mapping of nodes in a cell to logic levels (preferably, 0 or 1). Nodes generally refer to points in a circuit at the terminal of one or more circuit devices, and may suitably denote conductive wires, interconnections, terminals, or the like. Unless otherwise indicated, the nodes mapped by a vector for a logic cell preferably include only input and output nodes for the cell and each node constituting a wire at a control terminal of a switching device, such as a gate terminal wire of an FET transistor.

All vectors for a given cell are therefore defined with reference to the same combination of mapped nodes. Each vector is defined by the combination of logical levels (or values) concurrently occurring at these mapped nodes. In other words, if each mapped node is considered a logical variable, a vector effectively represents a unique instance of a logical word collectively formed by those variables. What distinguishes one vector from another, then, is the combination of values described for the mapped cell nodes. When a vector is enumerated, the content of these logic values are specifically identified.

A complete vector is one which specifies logic values for all mapped cell nodes. Values for some nodes may yet be omitted from the vector if otherwise completely determined in value by other specified nodes, and they do not form control terminals of a switching device. A partial vector is one which specifies values for a subset of all mapped cell nodes, while an empty vector is a partial vector with no values assigned to the nodes. Unless specifically noted otherwise, a vector referenced herein generally refers to either a complete vector or a partial vector. A feasible vector is either a partial or complete vector that is compatible both with the given cell's logic and any transition requirements for a particular parametric measurement.

A logical function, such as a Boolean function logically sums together a plurality of vectors that may be partially or fully specified. The logical sums of a function each represent a logical OR operation, with the vectors serving as the terms that are OR'd together. Each term is represented as a logical product of the node values specified by that term's vector. For example, if a given term's vector defined the values 010 with reference to nodes a, c, y, of the cell, the term would be represented as the logical product $a=0*c=1*y=0$.

As part of such characterization process, various parametric measurements (like delay, timing constraints, minimum pulse width, power, noise) are made using circuit simulation. The process automatically determines the wire (or synonymously herein, node) vectors for which those measurements may be made. That is, the netlist for a given cell is analyzed to determine a binary decision diagram (BDD) or other logic representation of a set of valid logic vectors (such as the logic setting of each transistor gate wire in the cell), then for each potential measurement a set of possible vectors compatible with that measurement is generated.

For the more complex cells, namely those which contain multiple logic components due to a merged component configuration or large implicit number of input bits (such as so-called one-hot multiplexers), the size of the global BDD logic representation that results for the cell may increase exponentially. The increased size leads to longer processor run-times, and in some cases very long processor run times followed by memory exhaustion and failure. Even if run times are not excessively lengthened, the number of possible measurement vectors enumerated could increase exponentially, exceeding the number which may be computationally analyzed within a reasonable amount of time. Moreover, many of the vectors may differ only in wires which do not affect the measurement and therefore need not be redundantly carried through to enumeration, but this would not be discoverable until enumeration and testing of the vectors has already occurred.

In accordance with certain aspects of the present invention, a cell characterization process which overcomes these and other shortcomings is provided. The subject system and method generally provide for a cell characterization process which makes BDD or other such logical expansion computationally manageable even for complex logic cells having multiple logic components, and which minimizes the number of candidate vectors generated for certain parametric measurements. The resulting cell characterization process provides logical function representations for given nodes of a cell in a manner that precludes from the function representations other nodes having no electrical relevance thereto.

The subject system and method accordingly provide for simple and efficient characterization of even complex logic cells containing multiple logic components. The computational efficiencies realized enable cells whose characterization would otherwise exceed the available processing capacity to be duly characterized, and cells whose characterization would have progressed anyway to require less processing time. The system and method provide among other things for: independent representation of the cell logic function for each wire of significance, omission of disconnected wires from each logic function, efficient determination of the relevant set of wires (and the vectors enumerated for them) for each parametric measurement of interest, and non-enumeration of wires not in the relevant set.

Figure 2:
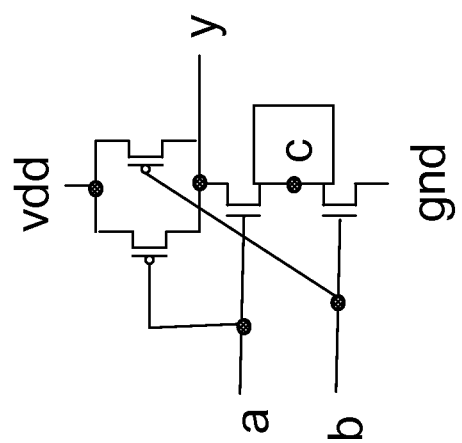
FIG. 2 is a schematic diagram illustrating an example of a device-level circuit for an inverter logic cell.
Figure 3:
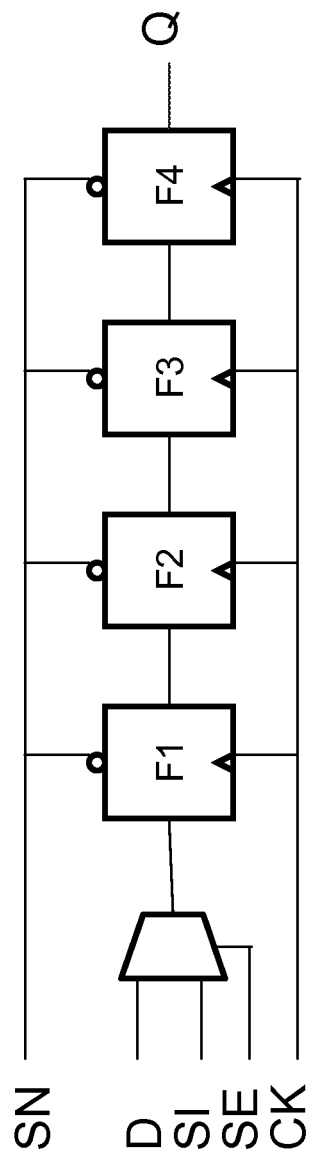
FIG. 3 is a schematic diagram illustrating an example of a multi-bit shift register cell.

Referring now to FIGS. 1-3, a logic cell is programmably implemented to model an electronic circuit that may be combined with other cells to collectively define a larger electronic circuit, such as an integrated circuit, for subsequent placement and routing. Each cell is preferably defined by a netlist including a device-level description of the constituent nodes, transistors, and other devices. FIGS. 1-2 schematically illustrate examples of device-level circuits for relatively simple logic cells, which may serve as logic components incorporated in a larger, more complex cell. FIG. 1 illustrates a NAND gate formed by interconnected FET transistors with input nodes a, b, output node y, and internal node c.

A vector for such logic cell/component includes all input and output nodes for the component and any nodes at a control terminal of a switching device. The vector for this NAND gate would therefore include values for nodes a, b, y. Since node c neither drives a switching device's control terminal (a transistor gate in this example) nor serves as an in input or output of the gate, it is safely omitted from the vector for the sake of simplicity. A suitable circuit simulator known in the art may be used to initialize the node to its proper logic value if the values for the transistor gate levels, inputs and outputs are specified. The three vector elements associated with this NAND gate yield eight possible vectors, but only the vectors 001, 101, 011, and 110 are consistent with the gate's topology and therefore feasible.

FIG. 2 illustrates a buffer realized by a sequentially coupling of consecutive inverters, each formed by interconnected FET transistors. The buffer's nodes include input node a, internal node c, and output node y. In this case, node c does get included in the gate's vector since it ties to a transistor gate input (of the second inverter section). The feasible vectors are 010 and 101.

Figure 4:
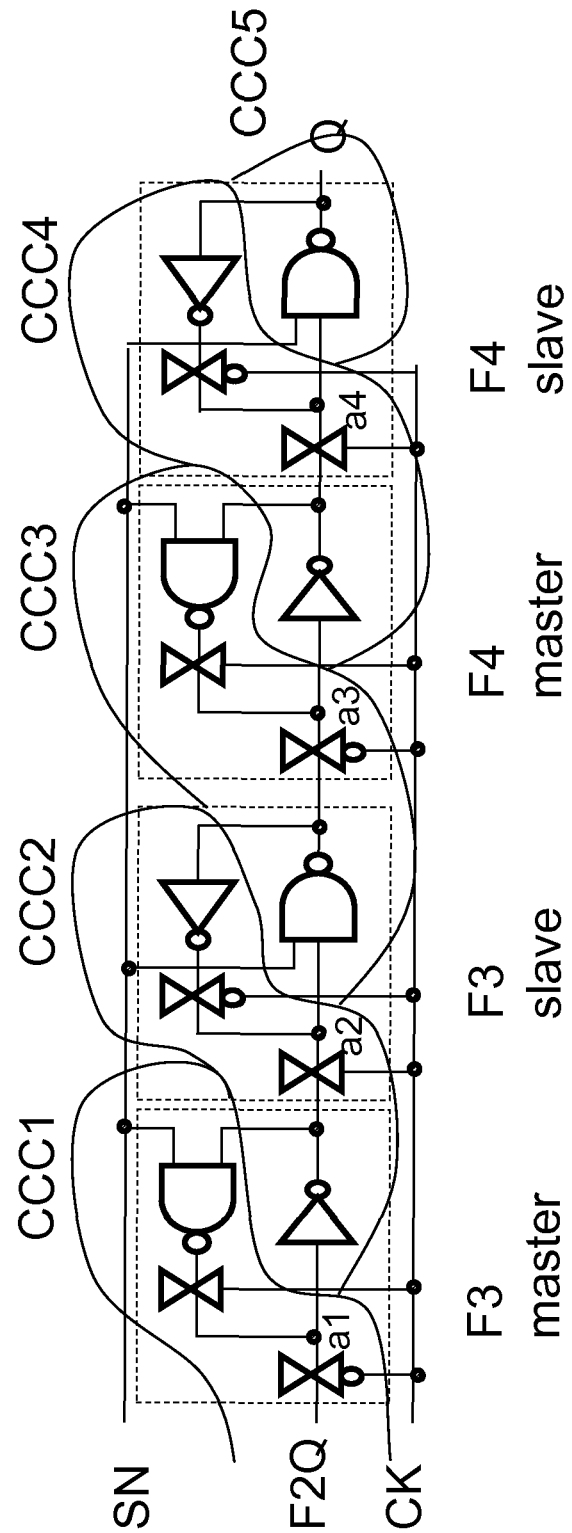
FIG. 4 is a schematic diagram illustrating an example of a device-level circuit for a portion of the logic cell shown in FIG. 3, illustrating a decomposition thereof in accordance with one exemplary embodiment of the present invention.

FIG. 3 schematically illustrates an example of a more complex logic cell which models a shift register having five inputs (signals SN, D, SI, SE, and a clock CK) and one output Q. The shift register is realized by an input multiplexer component followed by a chain of sequentially coupled flip flop components F1-F4. The device-level circuit showing just the last two flip flop components F3, F4 of this shift register cell is schematically illustrated in FIG. 4.

In accordance with certain exemplary embodiments of the present invention, such complex logic cells are first decomposed for logical function representation in terms of its vectors so that a set of feasible vectors for certain parametric measurements of interest may be selectively determined in computationally efficient manner. Examples of components CCC1-CCC4 resulting from such decomposition are illustrated in FIG. 4. (The other components resulting from the full decomposition of the entire shift register cell shown in FIG. 3, in the interests of brevity and clarity, are not shown.) As described in following paragraphs, local characteristic functions are generated for local output nodes of these components each with respect to all other nodes of the cell found to be electrically relevant thereto.

Figure 6:
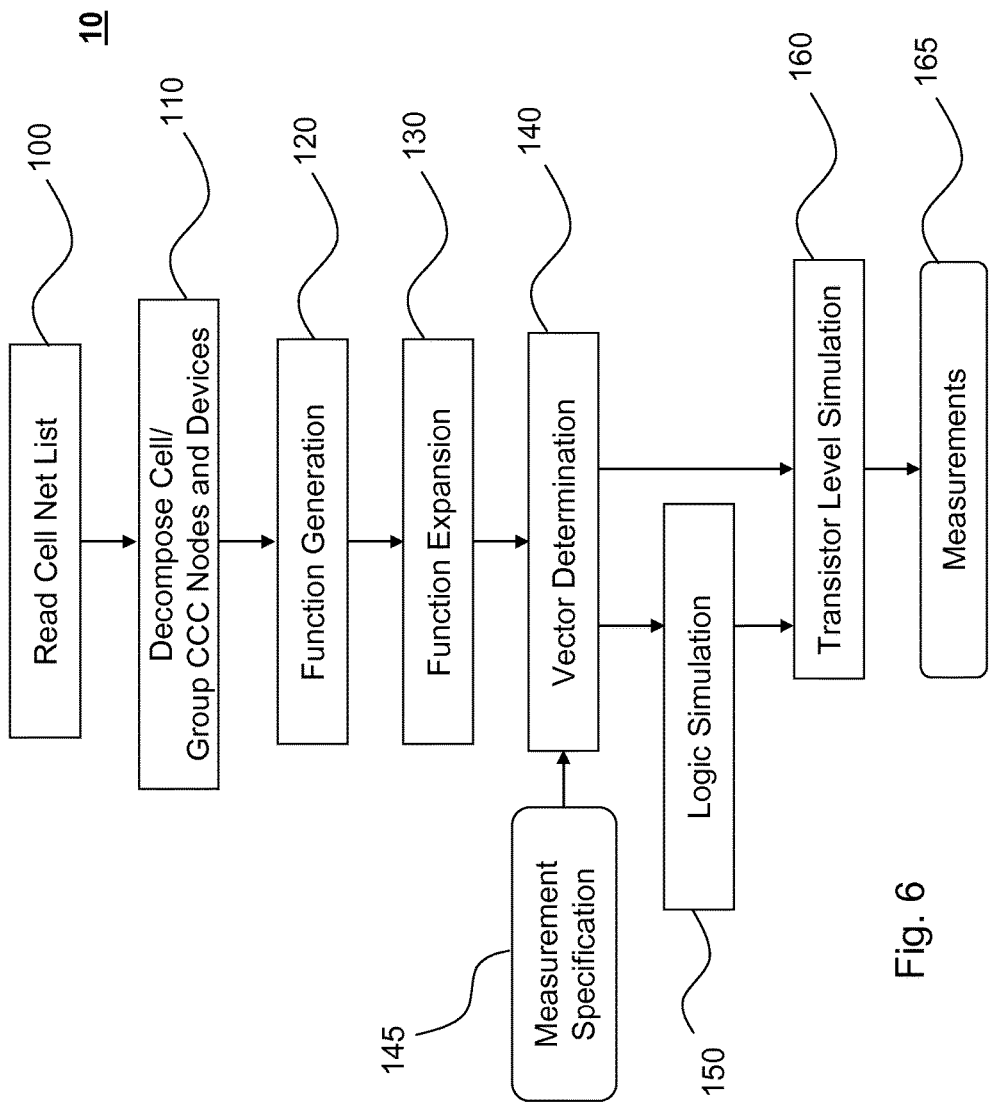
FIG. 6 is a schematic diagram illustrating a flow of processes in system formed in accordance with an exemplary embodiment according to an aspect of the present invention.

Turning to FIG. 6, there is shown a diagram illustrating a general flow of processes within a portion of cell characterization system 10 formed in accordance with one exemplary embodiment of the present invention. The illustrated flow of processes executed in a suitable computer processor(s) enables certain predetermined parametric measurements in computationally optimized manner. As a result, the overall processing load, typically measured in terms of such factors as CPU time, numbers of vectors enumerated, simulation time, and number of required simulations, is reduced. The measurable reduction will vary with the particular requirements and conditions of specific applications, but the degree of reduction will be increasingly notable for the more complex cells.

Each logic cell in the disclosed example is preferably defined by a preconfigured netlist, and the netlist for a given cell is read at block 100. At block 110, the cell is decomposed by grouping together certain nodes and devices of the cell into channel-connected component (CCC) portions. Each CCC portion is formed such that every node in that CCC portion is connected to another node of the portion by a conduction channel of a switching device (such as the source-to-drain transistor channel of an FET device). No two nodes reside in the same CCC portion if their only connection is via a transistor gate, for example.

For each CCC portion, a local output node is defined. This is the node in the CCC portion which constitutes either a cell output or a control terminal of a different CCC portion's switching device (such as the gate terminal of a transistor in another CCC). The input node for each CCC portion is a node of the CCC portion which constitutes either a cell output or a control terminal of (such as a transistor gate) of a switching device in that CCC portion. The input node for a CCC portion may also be a node of that CCC portion which constitutes a cell input (in the rare case that the cell input is not a transistor gate).

An example of such grouping into CCC portions is graphically illustrated in FIG. 4. This grouping/decomposition process is carried out by tracing successively backwards (upstream, with reference to a downstream direction being defined by the forward input to output flow of information through the cell) from each output and transistor gate wire (referred to herein as a sim-wire) of the cell. With a sim-wire or a cell output set as the local output node of a given CCC portion, the tracing occurs through a channel path extending from the conduction channel of one or more switching devices until a power plane, namely either a supply voltage VDD or ground is reached. That terminates the trace for one CCC portion, and a further upstream CCC portion is traced in like manner until all intervening logic components are exhausted, and the cell input is eventually reached. The system preferably creates and maintains a CCC dependency graph during this process.

The flow next proceeds to block 120 where a function generation module is executed to formulate a logic input function for the wire serving as the local output node in each CCC portion. This function, also referred to herein as the component characteristic function for a CCC portion is formulated as a logical sum of terms. Each term is composed by tracing a channel path extending from the CCC portion's local output node on through the conduction channel of one or more switching device to terminate at either a VDD or ground power plane. This is done recursively for each such channel path resulting for different logic values of the local output node, with each composed term being logically summed with every other term composed for the CCC portion. As each switching device conduction channel is traversed in a channel path, the value of the node at that switching device's control terminal which enables the traversal is noted and logically AND'd with the other node value(s) requisite to that channel path. This ensures that subsequent inputs will not be included in the channel characteristic function for cases where the switching device is switched off to a non-conducting state.

The component characteristic function for each CCC portion thus represents a logical sum of the locus of all partial vectors for nodes electrically connected to the portion's local output node. These partial vectors (formed by the terms defined for each channel path) each map the nodes within one channel path of the CCC portion to one potential combination of logic values.

As the component characteristic function is constructed, the number of BDD nodes is preferably tracked to make sure it does not exceed a reasonable predetermined limit. This flags those problematic cases, for instance, where excessive numbers of inputs are combined at a CCC portion in such a way that their inclusion in most terms of the component characteristic function cannot be avoided. The problem may then be detected and reported for evasive or remedial action before too much time is wasted.

At block 130, function expansion is carried out for the component characteristic function of each CCC portion's local output node, so as to generate a local characteristic function representing that local output node's relation to all other cell nodes having a direct logical or electrical impact thereon. The expansion has the effect of precluding any node that is not electrically connected to the local output node of a particular CCC portion from appearing in that CCC portion's local characteristic function. Preferably though not necessarily, the characteristic function generation and expansion of blocks 120, 130 is completed for all CCC portions up front after the cell's netlist is read, even before the parametric measurements to be carried out are determined. This is because the same set of local characteristic functions may be used to derive the feasible vectors for each measurement in a computationally optimized manner.

Function expansion executes to iteratively expand the component characteristic function of each CCC portion with respect to one or more upstream CCC portions, to form a local characteristic function for the given CCC portion. The expansion begins by selectively combining a CCC portion's component characteristic function with the component characteristic function of the nearest upstream CCC portion. Preferably, only those partial vectors (or terms) from the CCC portion's component characteristic function which contain the local output node of the upstream CCC portion are logically AND'd with the terms of the upstream component characteristic function, with the other partial vectors (terms) remaining as is. If the local output node of the next upstream CCC portion appears in any of the partial vectors in the resulting function, selective combination is repeated with reference to the next upstream component characteristic function. This continues until no more commonality with the next upstream local output node is found, or until a cell input node is reached. The resulting function is then taken as the beginning CCC portion's local characteristic function.

The expansion process is similarly carried out for each CCC portion, beginning with that portion's component characteristic function and expanding backwards to selectively combine, to the extent possible, with each successive upstream component characteristic function. A local characteristic function is thus obtained for each CCC portion's local output node, which does not include any upstream local output node electrically disconnected therefrom. Consequently, vectors which may not necessarily be inconsistent with a particular parametric measurement to be made, but which reflects no actual electrical connectivity with a node of interest (and therefore ineffectual to its logic state) is implicitly precluded from capture as a feasible vector.

Excessive BDD expansion is avoided in this manner by maintaining separate BDD representations (the component/local characteristic functions) at each of the CCC portion wires, making sure that the per-wire characteristic function does not reference any wire which is electrically disconnected (separated by switched off transistors) from the characteristic function wire, and combining characteristic functions only on an as needed basis.

The local characteristic function for each wire encompasses all permissible logic state combinations for each wire related to that wire. In certain embodiments, each wire is actually represented in a local characteristic function by two BDD variables: one for equal-to-zero and the other for equal-to-one. When combined, this yields four possible logic values: 0, 1, Z (floating), or X (conflicted). Wires which are omitted from a local characteristic function expression are electrically disconnected, which is distinct from those which are simply at logical don't-care states. Logical don't-care wires will still exist in the characteristic function with both 0 and 1 values. In a single wire representation, logical don't-care states would not be distinguishable from disconnected states. This could be significant because the state of logical don't-care wires may still affect timing or power of signals that propagate through the local characteristic function. Wires may appear in some terms of a local characteristic function and not in others when those wires are dynamically disconnected depending on other local characteristic function inputs.

Depending on the type of parametric measurement, up to three stages of function are examined to obtain the relevant wire set. Preferably, in order to avoid unnecessary expansion of the BDD as the set is expanded, enumeration of vectors is carried out incrementally as more wires are added to the relevant set. The initial set of wires driving the final output is enumerated first. The relevant set is then expanded separately for each state. This means that each BDD is represented by a single term (for which the number of nodes equals the number of variables) logically AND'd with the local characteristic functions of the inputs to the wires being added to the set. The complexity does not increase as more stages are examined since only a single term at a time propagates from the previous stage. The union of all terms produced at the final stage gives the enumerated vector list, with non-relevant wires left unspecified. The total number of vectors at each step is preferably tracked so that any problem cases can be caught and reported.

To illustrate the simplification obtained in this manner, consider a CCC portion local output node Y and an input node X, which undergoes a transition from 0 to 1. A local characteristic function $f$ of Y would then depend on X, and may also depend on another node A. It is possible for the local characteristic function g of node A to depend on a node B, although local characteristic function $f$ does not depend on node B. This would occur if function $f$ depends on node A only for a subset of its input node combinations (its OR'd terms) while function g depends on node B only for a different, disjoint subset of input node combinations. If a transition were to occur on node Y's input node X where both the functions $f$ and g depend on that node X, a possible occurrence is that at the beginning of the transition (X=0) function g depends on node B when function $f$ does not depend on function g's node A, but that at the end of the transition (X=1) function $f$ does depends on node A when function g no longer depends on node B. In that case, the state of node B is necessary to completely describe the transition even though function $f$ does not directly depend on node B. The combined function which includes all nodes relevant to the transition is then functions $f$ and g, OR'd with that portion of function $f$ which does not depend on node A. This illustrates a two stage local characteristic function, where function $f$ forms the first stage and function g forms the second stage.

Now, consider if function $f$ depends on multiple nodes A1 and A2 having the respective local characteristic functions g1 and g2 which both depend on X, with function g1 also depending on a node B1 and function g2 also depending on a node B2. In that case, functions g1 and g2 must both be included in the combined function since nodes B1 and B2 may be relevant to the effect of node X's transition on node Y. However, in many cases function $f$ does not simultaneously depend on the nodes A1 and A2. Instead, the function's dependency on these nodes may itself depend on the values of one or more other inputs nodes, generally referenced as nodes C's, which are independent of node X. The logical AND'ing of functions $f*g1*g2$ in that case creates an unnecessarily complex function. The complexity would be even worse if there were other additional functions g3, g4, g5, . . . to account for. This may be avoided by considering each combination of additional input nodes C's one at a time, such that the corresponding functions $f*g1$, $f*g2$, $f*g3$, . . . are separately considered, and the various g functions are not themselves directly combined. The complexity therefore increases as a logical sum of the input pin function complexity, rather than as a logical product of input pin function complexity, so long as the input nodes are separately active, not concurrently.

Additionally, consider a measurement requiring two transitions that occur sequentially: node X1 first transitioning from 0 to 1, then node X2 transitioning thereafter from 0 to 1. In the same way that one transition requires inclusion of the local characteristic functions g of some inputs to function $f$, the second transition requires including the local functions h of the inputs to function g. The functions h would comprise a third stage of functions.

Turning back to FIG. 6, at block 140, a vector determination is carried out on the local characteristic functions generated at block 130 to generate a plurality of feasible vectors. Because feasibility is determined by the particular requirements of the particular parametric measurement to be made, suitable measurement specifications are entered at block 145 to guide the vector determination process. This may be by user entry, table look up, automatic generation, or any other means suitable for the intended application. Examples of parametric measurements to be made include: leakage state power consumption, hidden power, delay arc timing, timing constraints between transitioning nodes, minimum pulse-width, and the like. Feasible vectors are generated according to the requirements specified for each of these parametric measurements in question, as described in greater detail below.

A feasible vector is one which is compatible with the given cell's logic and transition requirements for a particular parametric measurement. A sufficient set of feasible vectors collectively define all combinations of interrelated node logic levels permitting simulated analysis of a particular parametric measurement.

Though compatible, a feasible vector may still not be essential for the particular parametric measurement. Ideally, only those vectors that are both compatible and essential for a predetermined parametric measurement would be obtained by this process, so that any extraneous simulation processing due to feasible but non-essential vectors for a particular measurement may be avoided. But this is not realistically possible in most applications.

System 10 thus serves to preclude the occurrence of erroneous candidates for feasible vectors, while also reducing the number of vectors to be considered and operated on during the course of computing the feasible vectors. The vector determination process at block 140 is carried out on the various local characteristic functions and the select set of vectors they entail, rather than on a global characteristic function for the broader set of vectors indiscriminately entailed thereby. As the test results described in following paragraphs reveal, this tends to notably reduce the number of feasible vectors produced, as well as to reduce the processing time cost of extracting those feasible vectors, particularly for the more complex logic cells. Lesser numbers of feasible vectors also generally means less logic simulation processing to filter/confirm the feasible vectors as such (at block 150), and less device/transistor level simulation processing (at block 160) to make the actual parametric measurement.

The set of relevant wires established by the feasible vectors for a parametric measurement are those which reside on the input-to-output paths of the measurement and those which constitute inputs to the local characteristic functions of the wires on those paths. Wires not on the path include those which do not switch and those whose outputs do not trace an active path to the final output. This is determined differently for leakage power measurements (no switching inputs or outputs), hidden power measurements (switching inputs, no switching outputs), switching events measurements (switching inputs and outputs), and timing constraint and minimum pulse width events measurements (a sequence of two switching inputs and a switching output).

For the purpose of determining possible measurements, the unspecified wires can remain so. However, for final circuit simulation to actually make a measurement, the unspecified wires must be bound to some value (complete vector specification is required) which is internally consistent, in order to avoid simulator convergence issues and to guarantee consistent results across simulators. For instance the input and output of an internal inverter must be at opposite logic states, even if it does not matter which pair of states that is. The local characteristic functions are used to determine a complete vector for each partially specified one.

In the disclosed embodiment, this is preferably done through a search process. Each wire is considered in sequence from input to output. If the wire is already specified by the vector, that value is used in the complete vector. Otherwise, the two possible values are considered. In theory, this could yield an exponential process, but in practice it is linear in the number of wires. A wire being set is either determined by its inputs, by the given vector, or by both. If determined by both, the values will not conflict since all inputs to a set wire in a vector should also be specified in that vector. Again, the number of trials is tracked so that unexpected non-linear cases may be immediately detected and reported.

Depending on the parametric measurement to be made, the flow may proceed next from block 140 either to logic simulation at block 150 or directly to transistor level simulation at block 160. The logic simulation invoked at block 150 may be of any suitable type known in the art. It is generally an approximate simulation of a circuit's evolution which considers just the 0/1 logic levels of the circuit's nodes and the timing of 0-1, 1-0 transitions at each node. The transistor level simulation invoked at block 160 may also be of any suitable type known in the art, such as SPICE circuit simulation (Simulation Program with Integrated Circuit Emphasis), an analog simulation of a circuit's evolution which considers node voltage levels and device currents as they change continuously over time.

For such parametric measurements as leakage power consumption, where the cell is operationally dormant and no input or output switching occurs, no reduced set of vectors is necessary. The flow therefore proceeds directly to the transistor level simulation of block 160. For other parametric measurements, the flow preferably proceeds first to block 150 where logic simulation is carried out to determine the feasible vectors generated at block 140 for which the responsive node transitions appropriate for a particular measurement actually occur. Those feasible vectors are filtered out of the originally generated set, and passed on to transistor level simulation at block 150. The other feasible vectors for which appropriate transition response was not observed are discarded. The measurement results of the transistor level simulation are then read and stored at block 165.

Figure 7:
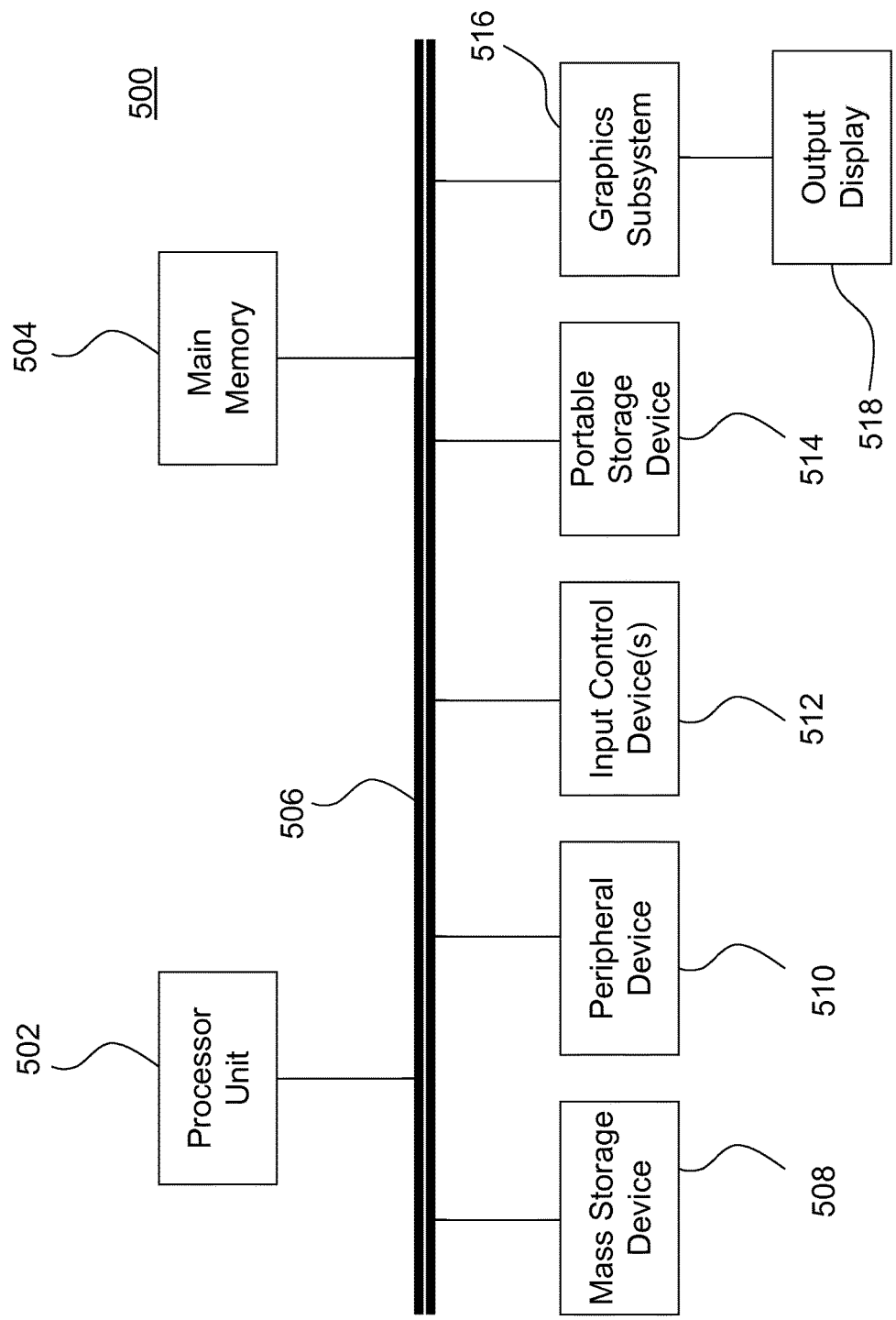
FIG. 7 is a block diagram illustrating an exemplary interconnection of units in a processor-based system for implementing the embodiments of systems and methods according to various aspects of the present invention.

FIG. 7 illustrates a block diagram of an exemplary computer system which may be employed to implement various embodiments in accordance with the present invention. The illustrative computer system 500 includes a processor unit 502, a main memory 504, an interconnect bus 506, a mass storage device 508, peripheral device(s) 510, input control device(s) 512, portable storage drive(s) 514, a graphics subsystem 516, and an output display 518. Processor unit 502 may include a single microprocessor or a plurality of microprocessors for configuring computer system 500 as a multi-processor system. Main memory 504 stores, in part, instructions and data to be executed by processor 502. Main memory 504 preferably includes banks of dynamic random access memory (DRAM) as well as high-speed cache memory.

For simplicity, the components of computer system 500 are connected via interconnect bus 506. However, computer system 500 may be connected through one or more other data transport measures of any suitable type known in the art, both wired and wireless. For example, processor unit 502 and main memory 504 may be connected via a local microprocessor bus and mass storage device 508, peripheral device(s) 510, portable storage medium drive(s) 514, and graphic subsystem 516 may be connected via one or more input/output (I/O) buses. Mass storage device 508, which may be implemented with a magnetic disk drive, an optical disk drive, a solid state device, or an attachment to network storage, is non-volatile storage device for storing data, databases, and instructions, to be used by processor unit 502. In a software embodiment, mass storage device 508 may store the software to load it into main memory 504. Mass storage device 508 may include any form of non-transitory computer readable media and may include multiple forms of different media.

Portable storage medium drive 514 operates in conjunction with a portable non-volatile storage medium such as a floppy disk, a compact disk read only memory (CD-ROM), a digital versatile disk read only memory (DVD-ROM), or a memory card such as e.g. Secure Digital High Capacity (SDHC), to input and output data and code to and from the computer system 500. In certain embodiments, the software is stored on such a portable medium, and is input to computer system 500 via portable storage medium drive 514. Peripheral device(s) 510 may include any suitable type of computer supported device known in the art, such as an input/output (I/O) interface, to add additional functionality to computer system 500. For example, peripheral device(s) 510 may include a network interface card to interface computer system 500 to a network.

Input control device(s) 512 provide a portion of the user interface for a computer system 500 user. Input control device(s) 512 may include an alphanumeric keypad for inputting alphanumeric and other key information; and a cursor control device such as a mouse, a track pad or stylus, or cursor direction keys.

In order to display textual and graphical information, computer system 500 contains graphic subsystem 516 and output display(s) 518. Output display 518 may include a cathode ray tube (CRT) display, liquid crystal display (LCD), plasma, digital light processing (DLP) or active matrix organic light emitting diode (AMOLED) display. Graphic subsystem 516 receives textual and graphical information and processes the information for output to display 518.

In a software implementation, a method formed in accordance with an exemplary embodiment of the present invention includes a plurality of computer executable instructions, to be implemented on a computer system. Prior to loading in the computer system, the software may reside as encoded information on a computer-readable tangible or non-transitory medium such as a magnetic floppy disk, a magnetic tape, CD-ROM, DVD-ROM, flash memory, or any other suitable computer readable medium.

In a hardware implementation, such a system in accordance with an exemplary embodiment of the present invention may be realized in any suitable computer based platform known in the art. For example, the system may comprise suitable storage media and one or more dedicated processors or shared processors executing/controlling other functions, wherein the employed processor(s) is programmably configured with processor instructions for performing the functions described herein. Suitable circuits may also be developed to execute certain aspects of these functions.

ILLUSTRATIVE OPERATIONAL EXAMPLES

Operational Example 1: Local Characteristic Function Generation—Long Shift Register Referring back to FIG. 4 schematically illustrating just the last two flip flop components F3, F4 of the shift register cell shown in FIG. 3, the nodes for each vector of the cell include the inputs SN, F2Q, CK, output Q and internal nodes a1, a2, a3, and a4. (In a physical implementation of the circuit there would also be a node for internal signal CKinv, the inverse of input clock CK, which would be applied everywhere CK is applied. This is not included in the interests of clarity and brevity.)

In the disclosed embodiment, each node value is actually set by the combination of two or more logic variables. The exact assignment may vary, but these logic variables provide for 0, 1, Z (floating), and X (conflict) logic levels. Notably, a node which is electrically significant for another node will have its variables included in the local characteristic function for that other node, even if it is permitted by the cell's logic to take on both 0 and 1 values at a particular operational state. A node's logic variables will be excluded from the local characterization function (precluding even the Z and X values for the node) only if that node is electrically disconnected from that other node to which the local characteristic function applies.

Then for the reduced 2 bit shift register portion shown in FIG. 4, the generation of component characteristic and local characteristic functions for each of the CCC portions CCC5 (output Q), CCC4 (node a4), CCC3 (node a3), CCC2 (node a2), and CCC1 (node 1) are constructed as follows. The clock node CK is denoted by "C" in the function expressions.

For Local (and Global) Output Node Q of CCC5:

For simplicity, the combined logical value provided by the logic variables is represented in this illustration. A logical AND is represented by the symbol * while a logical OR is represented by the symbol +.

The initial component characteristic function for node Q (from CCC5) would be:

$$SN=0*a4=0*Q=1+SN=0*a4=1*Q=1+\\SN=1*a4=0*Q=1+$$

$$SN=1*a4=1*Q=0. \quad (1)$$

The component characteristic function for node a4 would be:

$$a4=0*C=0*Q=1+a4=0*C=1*a3=1+\\a4=1*C=0*Q=0+a4=1*C=1*a3=0.$$

The component characteristic function for node Q (1) is expanded in the upstream direction, starting with the a4 function of CCC4. The two nodes' functions are selectively combined by logically AND'ing together just the terms in the Q function which include an expression for node a4, and retaining the other terms of the Q function which do not include any expression for node a4. (But in this particular case, all terms of the Q function include the node a4.) This gives:

$$SN=0*a4=0*Q=1*C=0+\\SN=0*a4=0*Q=1*C=1*a3=1$$

$$+SN=0*a4=1*Q=1*C=1*a3=0$$

$$+SN=1*a4=0*Q=1*C=0+\\SN=1*a4=0*Q=1*C=1*a3=1$$

$$+SN=1*a4=1*Q=0*C=0+\\SN=1*a4=1*Q=0*C=1*a3=0 \quad (2)$$

The resulting Q function (2) is next expanded further by similar selective combination with the component characteristic function of node a3 (in CCC3) shown below:

$$a3=0*C=1*a4=1*SN=1+a3=0*C=0*a2=1*SN=1$$

$$+a3=1*C=1*a4=0*SN=0+a3=1*C=0*a2=0*SN=0$$

$$+a3=1*C=1*a4=0*SN=1+a3=1*C=0*a2=0*SN=1$$

$$+a3=1*C=1*a4=1*SN=O+a3=1*C=0*a2=1*SN=0.$$

Further selective combination with this a3 function gives:

$$SN=0*a4=0*Q=1*C=0+\\SN=0*a4=0*Q=1*C=1*a3=1$$

$$+SN=1*a4=0*Q=1*C=0+\\SN=1*a4=0*Q=1*C=1*a3=1$$

$$+SN=1*a4=1*Q=0*C=0+\\SN=1*a4=1*Q=0*C=1*a3=0. \quad (3)$$

The difference of this selective combination from a simple AND'ing operation of the two functions is apparent. Not all terms of the Q function (2) resulting from selective combination with the previous a4 function are dependent on node a3 (include an expression for node a3). Only those terms that do are affected by the AND'ing operation.

The function being expanded (the Q function in the current case) is selectively combined in this manner iteratively with each of the component characteristic functions of the upstream CCC portions. The order in which this occurs is immaterial to the function expansion process itself.

Figure 5:
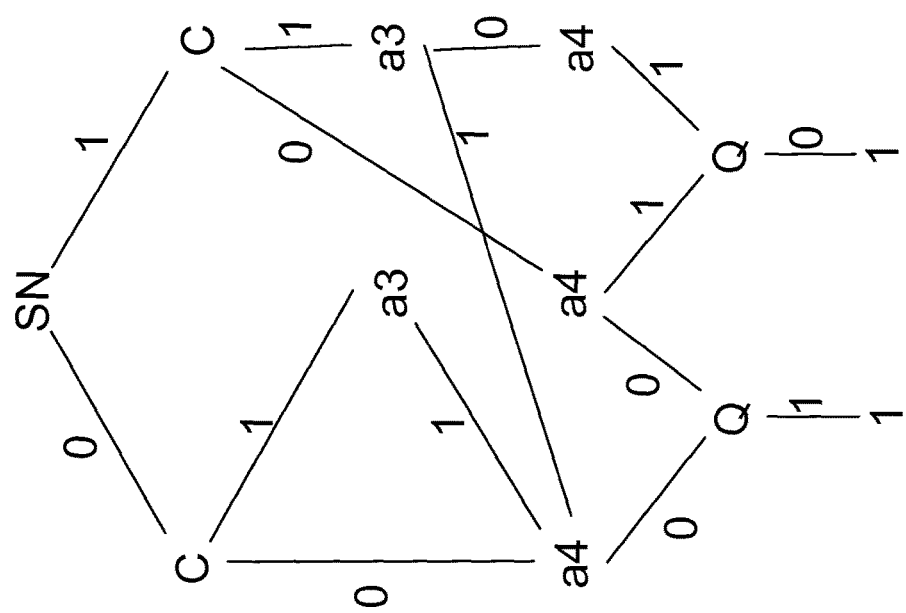
FIG. 5 is a schematic diagram graphically illustrating a local characteristic function generated in connection with the decomposition shown in FIG. 4.

Since the further resulting Q function (3) is without any newly-introduced nodes (for example, none of the a2 terms remain) there is no further expansion to be made, so the Q function (3) serves as the local characteristic function for the local output node Q of CCC5 (which node also happens to be a cell output in this case). This local characteristic function (3) is graphically represented in the partial BDD diagram of FIG. 5.

Similar expansions are carried out to construct the respective local characteristic functions for each of the local output nodes of CCC4-CCC1. These are shown below:

For Local Output Node a4 of CCC4:

$$C=0*a4=0*Q=1*SN=1+C=0*a4=1*Q=0*SN=1+\\C=0*a4=1*Q=0*SN=0$$

$$+C=1*a4=0*a3=1*SN=1+C=1*a4=1*a3=0*SN=1+$$

$$C=1*a4=1*a3=0*SN=0.$$

For Local Output Node a3 of CCC3:

$$C=0*a3=0*a2=1*SN=1+C=0*a3=1*a2=0*SN=1+\\C=0*a3=1*a2=0*SN=0$$

$$+C=1*a4=0*a3=1*SN=1+C=1*a4=1*a3=0*SN=1+$$

$$C=1*a4=1*a3=0*SN=0$$

For Local Output Node a2 of CCC2:

$$C=0*a2=0*a3=1*SN=1+C=0*a2=1*a3=0*SN=1+\\C=0*a2=1*a3=0*SN=0$$

$$+C=1*a2=0*a1=1*SN=1+C=1*a4=1*a1=0*SN=1+$$

$$C=1*a4=1*a1=0*SN=0$$

For Local Output Node a1 of CCC1:

$$C=0*a1=0*a0=1*D=0*SN=1+\\C=0*a1=1*a0=0*D=1*SN=1+$$

$$C=0*a1=1*a0=0*D=1*SN=0$$

$$+C=1*a2=0*a1=1*SN=1+C=1*a2=1*a1=0*SN=1+$$

$$C=1*a2=1*a1=0*SN=0$$

Figure 8A:
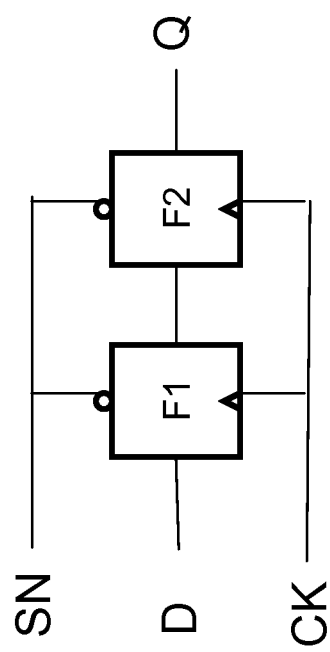
FIG. 8A is a schematic diagram illustrating another example of multi-bit logic cell.
Figure 8B:
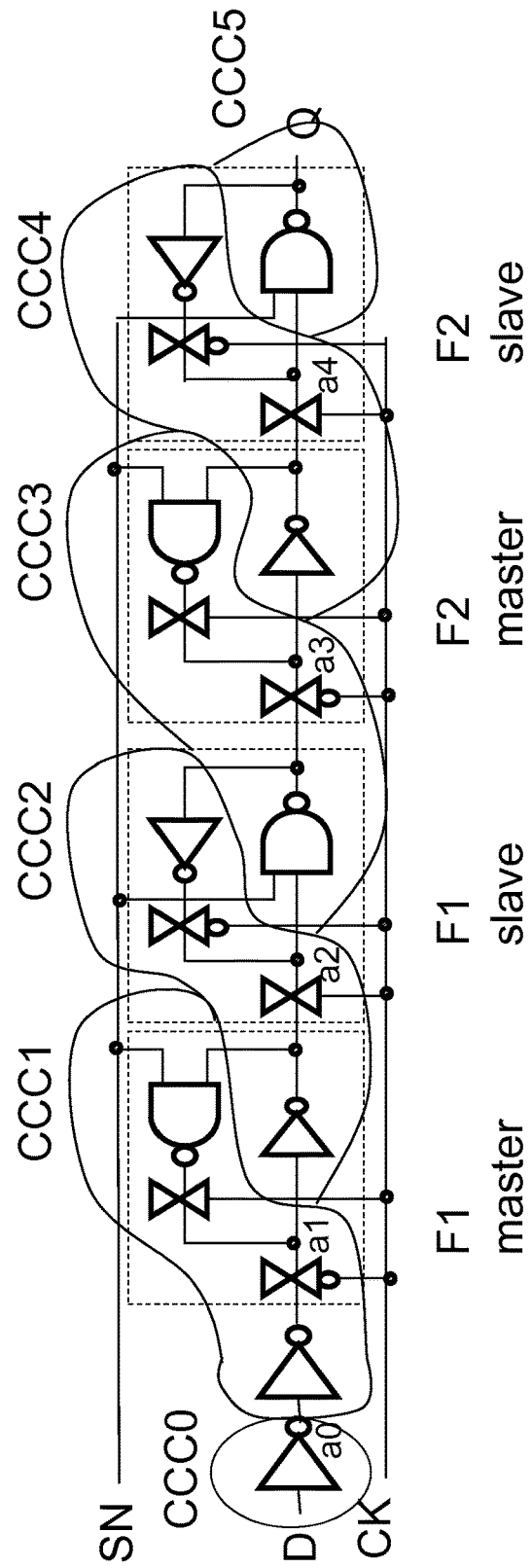
FIG. 8B is a schematic diagram illustrating an example of a device-level circuit for the logic cell shown in FIG. 8A, illustrating a decomposition thereof in accordance with one exemplary embodiment of the present invention.

If the shift register portion of FIG. 4 was alternatively configured as a standalone 2 bit shift register such as schematically illustrated in FIGS. 8A-8B, CCC0 would be defined at the cell's input D. The local output node for CCC0 would then be formed by the node a0. The local characteristic function would be:

$$a0=0*D=1+a0=1*D=0.$$

In general function terms, the expansion with respect to upstream node N may be represented by the expression:

$$h=\text{forall}(f,N)+g*f*\sim\text{forall}(f,N)$$

In this expression, f represents the original component characteristic function (or partial function) being expanded, g represents the component characteristic function for the current upstream N, and h is the expanded function. In certain exemplary implementations of the disclosed embodiment, the 'forall' operation represents a universal quantification of the variables representing N; which operation returns the function containing terms which are true for all combinations of the variables of N. (See the Implementation Example illustrated below.)

A notable effect of this method of formulating local characteristic functions is that data does not propagate through the flip-flops. Terms of the function with the clock state disabled for the slave latch will not include the output of the master latch and so will not depend on the data. Those terms of the slave function which do include the master output will have the clock set such that only the terms of the master function which do not include the data input will be included in the slave function. Thus, the clock to output switching path for sequentially connected flip-flops will not include combinations of the input flip flops, unlike the case in a simple dependency graph. Additionally, the process makes no assumptions about circuit topology.

Operational Example 2: Feasible Vector Determination for Switching Event Measurement in 2-Bit Shift Register Cell, from CK Rise to Q Rise Referring to the 2 bit shift register schematically illustrated in FIGS. 8A-8B, the vector determination process starts with the local characteristic function for Q:

$$C=0*a4=0*Q=1*SN=1+C=0*a4=1*Q=0*SN=1+\\C=0*a4=1*Q=0*SN=0+$$

$$C=1*Q=1*a4=0*a3=1*SN=1+\\C=1*Q=0*a4=1*a3=0*SN=1+$$

$$C=1*Q=0*a4=1*a3=0*SN=0$$

Enumeration over inputs not dependent on Q (depending only on SN) gives:
{SN=0, SN=1}

For SN=0 case:

$$C=0*a4=1*Q=0*SN=0+\\C=1*Q=0*a4=1*a3=0*SN=0$$

Combined with inputs a3, a4:

$$(C=0*a4=1*Q=0*SN=0+\\C=1*Q=0*a4=1*a3=0*SN=0)$$

$$*(C=0*a4=1*Q=0*SN=0+C=1*a4=1*a3=0*SN=0)$$

$$*(C=0*a3=1*a2=0*SN=0+C=1*a4=1*a3=0*SN=0)$$

This gives partial vectors:

$$C=0*a4=1*Q=0*SN=0*a3=1*a2=0,\\C=1*Q=0*a4=1*a3=0*SN=0$$

For SN=1 case:

$$C=0*a4=0*Q=1*SN=1+C=0*a4=1*Q=0*SN=1$$

$$+C=1*Q=1*a4=0*a3=1*SN=1+\\C=1*Q=0*a4=1*a3=0*SN=1$$

Combining with inputs a3, a4 gives:

$$(C=0*a4=0*Q=1*SN=1+C=0*a4=1*Q=0*SN=1$$

$$+C=1*Q=1*a4=0*a3=1*SN=1+\\C=1*Q=0*a4=1*a3=0*SN=1)$$

$$*(C=0*a4=0*Q=1*SN=1+C=0*a4=1*Q=0*SN=1$$

$$+C=1*a4=0*a3=1*SN=1+C=1*a4=1*a3=0*SN=1)$$

$$*(C=0*a3=0*a2=1*SN=1+C=0*a3=1*a2=0*SN=1$$

$$+C=1*a4=0*a3=1*SN=1+C=1*a4=1*a3=0*SN=1)$$

This gives partial vectors:

$$C=0*a4=1*Q=0*SN=0*a3=1*a2=0,\\C=1*Q=0*a4=1*a3=0*SN=0,$$

$$C=0*a4=0*Q=1*SN=1*a3=0*a2=1,\\C=0*a4=1*Q=0*SN=1*a3=0*a2=1,$$

$$C=0*a4=0*Q=1*SN=1*a3=1*a2=0,\\C=0*a4=1*Q=0*SN=1*a3=1*a2=0,$$

$$C=1*Q=1*a4=0*a3=1*SN=1,\\C=1*Q=0*a4=1*a3=0*SN=1$$

But logically AND'ing these partial vectors with C=0*Q=0 (to determine rise to rise delay) leaves the following:

$$C=0*a4=1*Q=0*SN=0*a3=1*a2=0,$$

$$C=0*a4=1*Q=0*SN=1*a3=0*a2=1,$$

$$C=0*a4=1*Q=0*SN=1*a3=1*a2=0$$

The corresponding complete vectors are then found to be:

$$C=0*a4=1*Q=0*SN=0*a3=1*a2=0*a1=0*a0=1*D=0$$

$$C=0*a4=1*Q=0*SN=1*a3=0*a2=1*a1=0*a0=0*D=1$$

$$C=0*a4=1*Q=0*SN=1*a3=1*a2=0*a1=0*a0=1*D=0$$

The D=1 case is also possible but not necessary.

Of these feasible vectors, executing logic simulation eliminates the cases where SN=0 or a3=0, leaving only the vector:

$$C=0*a4=1*Q=0*SN=1*a3=1*a2=0*a1=0*a0=1*D=0$$

Feasible Vector Determination Examples:
Adaptation to Different Parametric Measurements For each parametric measurement, a set of vectors defining different combinations of cell node values must be produced specifying all possible combinations of node values for which the measurement might be possible. Not all node values need be specified, only those which are electrically relevant to the measurement being made. How this is determined is normally different for each measurement type. Also, not all vectors for a measurement will have the same subset of nodes specified. Which nodes are significant may depend on the setting of other nodes in the vector.

Switching Measurements (Delay and Power)

For switching events, the relevant wires are those which directly switch the output (are part of the characteristic function for that output), and those able to switch any of the wires which switch the output but only indirectly. An example of the latter is a flip-flop data input. Such input can switch an internal node, and the internal node can switch the output (or could if it could switch independently) but the data input cannot switch the output. This is sufficiently restrictive that all relevant wires may be enumerated such that a liberal definition of relevant wires is feasible. The output wire's local characteristic function is examined for all terms in which the switching input is connected. For each term, the local characteristic function of each wire in that term is logically AND'ed with the term to obtain the set of all wires which can switch a directly switching wire. All terms for the resulting function give the set of vectors with all relevant wires enumerated, and all other wires unspecified.

That is, switching measurements determine the delay between an input transition and an output transition caused by that input. For such a measurement to exist, a necessary condition is that the input be part of the output characteristic function. If that is the case, then all nodes in the sub-function which depends on the input node must be considered in all valid combinations. These are not sufficient however. Referring to the shift register cell example of FIG. 4, the node a3 is included when CK is high, but not when CK is low. When CK is low, node a3 depends on node a2, but it does not when CK is high. So the Q function does not include a3. If an input transition on CK is of interest, then node a3 has the potential to transition as do nodes a4 and Q, so the nodes for both states of node a3 (such as a2) must be included even though there is no state for which Q depends on node a2 directly. This is done by AND'ing the sub-function (or terms of the local characteristic function) of Q which depends on CK with the function for each input of that sub-function which also depends on CK. Vectors are generated from the resulting composite function which include both direct and indirect dependencies.

Constraint and MPW Measurements

Timing constraints and minimum pulse widths are measured between two sequential switch events. Wires relevant to the first switch are those found in the terms of a local characteristic function which contain any of the switching inputs. Wires relevant to the second switch are those found in the terms of the first-switch-wire characteristic functions and which contain any of the switching inputs. Finally, a third stage of consideration is added for those wires which indirectly affect the second-switch wires.

Constraint measurements determine the minimum interval between two input pin transitions which permits internal nodes and outputs to transition as expected—that is, as they would transition relative to the inputs if the inputs were separated by an arbitrarily large interval. This is a function of the internal delay paths from the inputs to the monitored internal node.

The determination of vectors is similarly carried out for constraints as for switching. One difference is that the output becomes the monitored node, which is possibly an output node or an internal node. The subset of the characteristic function which depends on either of the nodes must be considered. It cannot be assumed which transition comes first, so it is necessary to test and confirm that a wrong ordering actually produces a different result compared to the correct ordering. Otherwise, no constraint can be determined. It is necessary for the feasible vectors to cover combinations of all nodes relevant for either ordering.

The composition of the characteristic function with its dependent node characteristic functions is done twice, introducing two levels of indirect dependence since the effect of the second transition will depend on the result of the first transition which is itself similar to the switching measurement case.

Minimum pulse width (MPW) measurements are constraint measurements between two consecutive transitions on the same input pin. The vectors are determined much as for constraints, except that only a single input wire is used. However, two levels of indirect dependence are considered, as for constraints.

Leakage Power Measurements

Leakage measurements are power measurements for a static state cases where no input or output node switches in value. Since there is no path defined, there is no need to specify a reduced set of vectors. The only requirement is that the values in the given vectors be consistent with all characteristic functions. The number of vectors enumerated is arbitrary. If complete enumeration of vectors is not feasible then it is possible to specify a set of partial vectors as input to the system. For each of those vectors, the vector completion function (see the implementation example below) is preferably invoked to determine a consistent complete vector to measure. If no partial vectors are supplied, a single completely unspecified (all nodes don't-care) is used as input to vector completion, and the return vector used for measurement.

Hidden Power Measurements

Hidden measurements are power measurements for cases where an input switches but no output switches. Since there is no complete path through the cell, there is no need to specify a complete subset of vectors. However, it is still useful to determine whether the occurrence of hidden measurements is possible. Toward that end, at least one vector is preferably determined to enable the measurement, even where complete enumeration of states is not feasible. A set of desired partial vectors may be specified as input to the system if more than one instance is desired.

A feasible hidden vector is constructed incrementally for each output node. First, a partial vector which is hidden at one output is determined, then it is further filled in for each subsequent output (order is arbitrary). If no hidden solution is possible at an output because of previous settings, the process is repeated with a different partial vector.

Determination of hidden partial vector at a single output is executed by first enumerating those partial vectors for which the input is disconnected from the output. If no such case succeeds, all vectors reflecting switching cases at the output are enumerated. The switching partial vectors are completed then tested by logic simulation to confirm the absence of output switching. If logic simulation indicates no transition on the output then the original partial vector is confirmed and used for the measurement.

Sample Test Results

Figure 9:
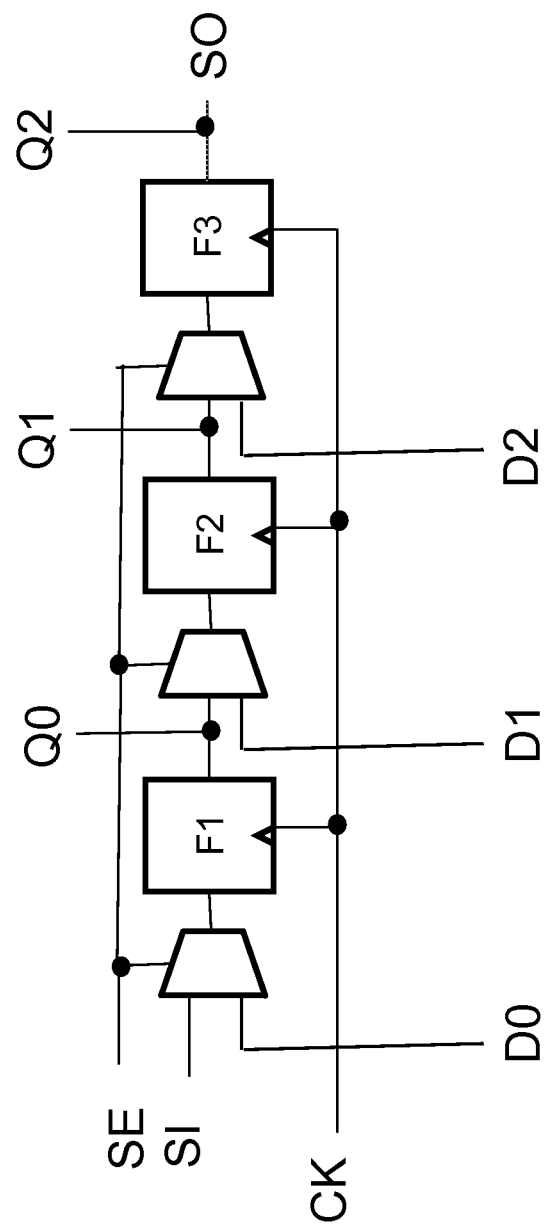
FIG. 9 is a schematic diagram illustrating yet another example of a multi-bit logic cell.

System 10 as disclosed herein has been tested on a variety of test cases including 8×8-bit register files and flip-flop arrays. The following results have been obtained with a cell formed by a set of flip-flop arrays of the type schematically illustrated in FIG. 9, with scan alternatively configured for 1, 3, 6, and 12 bits. A 3-bit configuration is schematically illustrated in FIG. 9. The test cases were run with the computational optimization of system 10 alternately enabled and disabled in the test system.

It was found with the processing resources available for the test system, larger flip-flop array configurations having more input bits could only be processed within a reasonable amount of time when the computational optimization of system 10 were invoked. This is evident in the tables of comparative test results shown, for example, in FIGS. 12A-12B. These tables, as well as the tables shown in FIGS. 10-11, reflect SPICE simulation results for a 1-bit configuration SDFT1 of the shift register cell illustrated in FIG. 9; for the 3-bit configuration SDFT3 of the shift register cell of FIG. 9; for a 6-bit configuration SDFT6 of that shift register cell; and, for a 12-bit configuration SDFT12 of that shift register cell (also for a 32-bit configuration in FIG. 12B). The results for those test cases run with the system embodiment 10 shown in FIG. 6 activated are listed under the column heading "With Computational Optimization."

The table in FIG. 10 reflects CPU run times for just the pre-simulation phase of operation to generate and filter/confirm the feasible vectors for a selected set of parametric measurements. With reference to FIG. 6, this phase of operation would span the processes 100-150 of operation for system 10. These CPU run times do not include the SPICE circuit simulation run times. The table in FIG. 11 is similar to the table in FIG. 10 in all respects, except that the total CPU run times there do include circuit simulation run times. That portion of the total CPU run time consumed by SPICE circuit simulation is listed out in a separate column for each test case.

Both the tables in FIGS. 10-11 reflect test results with some filtering of vectors already available on the test system, namely redundant vector removal setting available for timing constraint measurement vectors. This feature offers some benefit to the extent that it enabled the 6-bit and 12-bit test case runs to complete in an allotted time (not so in the test cases of FIGS. 12A-12B which were run without such redundancy filtering on the constraint vectors). Still, the benefit is marginal at best.

As the test results indicate, a significant difference appears both in the total number of feasible vectors generated (collectively for all measurements) and both the pre-simulation and simulation-inclusive CPU run times for the multi-bit cells. Even in the 1-bit cell SDFT1 case, the number of total vectors generated is cut by more than half when the computation optimization of system 10 is activated. The savings become more pronounced as cell complexity increases with the number of bits.

Additional test results are shown in FIGS. 12A-12B. The comparative test results in these tables again reflect test runs made on different bit-sized configurations SDFT1-SDFT32 of the same shift register cell illustrated in FIG. 9, for the same set of parametric measurements as for the tables of FIGS. 10-11. The table of FIG. 12A includes comparative listings for the total CPU time (inclusive of circuit simulation), total number of SPICE circuit simulations required, and total simulation run time for cells SDFT1-SDFT12. The table of FIG. 12B reflects comparative vector and total CPU time (inclusive of circuit simulation) as in FIG. 11, but for a 32-bit configuration SDFT32 of the cell. The different numbers of vectors and CPU run times shown, compared to the results shown in FIGS. 10-11, reflects differences in test system setup and/or differences in various sensitivity thresholds and other test settings. But the most significant difference is likely attributable to the redundant vector removal setting in the test system being turned ON for all test runs reflected in FIGS. 10-11, but turned OFF for all test runs reflected in FIGS. 12A-12B.

Again, the savings in terms of the listed parameters when the computational optimization of system 10 is activated is increasingly evident with increasing cell complexity. A particularly notable observation from the test results shown in these FIGS. 12A-12B is that certain of the test cases run without computational optimization activated failed to complete either the feasible vector determination or circuit simulation (within an allotted time frame), while all test cases run with computational optimization of system 10 activated all ran through to completion, even for the 32-bit cell case. The number of vectors determined and total CPU time for that 32-bit case was less than for the 3-bit case run without computational optimization activated.

Implementation Example

The following is but one illustrative example of numerous ways in which certain portions of system 10 may be implemented in the disclosed embodiment. The flow of processes, and the sub-processes, routines, and functions they employ may be programmably implemented in computer executable form using one or more suitable computer processing platforms known in the art (such as the example shown in FIG. 7).

In the functional descriptions below, various routines use logic functions which are Boolean functions of cell nodes. The cell nodes can take on the values 0, 1, Z and X, where 0 and 1 are logic levels, Z denotes an unknown logic level because the node is floating, and X denotes an unknown logic level because the node is driven by multiple conflicting sources. Four distinct functions of a single node are indicated by particular notation. The function of a node N being True when node N is at logic level 1 and False otherwise is represented as $N=1$. The function of node N being True when node N is at a logical level 0 and False otherwise is represented as $N=0$. Likewise for $N=X$ and $N=Z$.

The functions are represented in this implementation using Boolean-decision-diagrams (BDD). As noted in preceding paragraphs, four-value nodes are represented by the combination of two BDD variables. If two BDD variables for node N are labeled a and b, then the mapping used is $a*\sim b$ for $N=0$, $\sim a*b$ for $N=1$, $\sim a*\sim b$ for $N=Z$, and $a*b$ for $N=X$.

The use of the BDD representation is also not a requirement of these routines. Whatever representation is used must have the property that if the value of node N does not affect the output of function $f$ for any combination of other variables, then node N should not appear in the representation of f. This requirement is satisfied by BDDs but not by other known representations, such as zero-suppressed decision diagrams (ZDD). As an example, the function a=0*N=0+a=0*N=1+a=0*N=x+a=0*N=z would be the same as the function a=0 and should have the same representation. The function a=0*N=0+a=0*N=1 would not omit the node N since the function value is different if N=x or N=z. The same is true for the function a=0*N=0+a=0*N=1+ a=0*N=z+a=1*N=x.

Cell Characterization Overall Flow

Processes delineated in further detail below are marked (*).

1. Read cell netlist.
2. *Group nodes and devices into CCCs.
3. *Determine the CCC characteristic function for each CCC output.
4. *Determine the local characteristic function for each CCC output.
5. *Determine feasible vectors for each leakage state.
6. Use SPICE simulation to determine power consumption at each feasible vector.
7. Save simulation results in association with each simulated vector.
8. Loop1: for each cell input node X1 and transition direction D1
9. *Determine feasible vectors (partial and complete) for hidden measurements on (X1, D1).
10. Use logic simulation to determine which of the feasible vectors actually have no output transitions and discard all others.
11. For each remaining vector, use SPICE simulation to determine power consumption for a variety of input slews.
12. Save simulation results in association with (X1,D1) and the partial vector simulated.
13. Loop1: end
14. Loop2: For each cell input node X1 and transition direction D1.
15. Loop3: For each cell output node Y2 and transition direction D2.
16. *Determine feasible vectors for the delay arc from (X1, D0 to (Y2, D2).
17. Use logic simulation to determine which of the feasible vectors actually produce the output transition (Y2, D2) in response to input (X1, D1) and discard all others.
18. For each remaining vector use SPICE simulation to determine X1 to Y2 delay, power consumption, and noise response.
19. Save simulation results in association with (X1,D1), (Y2,D2) and the simulated vector.
20. Loop2: Loop3: end
21. Loop4: For each cell input node X1 and transition direction D1.
22. Loop5: For each cell input node X2< >X1 and transition direction D2.
23. Loop6: For each CCC output node Y3 and transition direction D3.
24. *Determine feasible vectors for constraints between X1 and X2 measured at Y2.
25. Use logic simulation to determine vectors for which Y2 transitions when X1 transitions before X2, but not when X2 transitions before X1, and discard all others.
26. For each remaining vector, use SPICE simulation to determine the minimum (X1,D1) to (X2,D2) delay for which (Y3,D3) occurs.
27. Save simulation results in association with (X1,D2), (X2, D2) and the associated vector.
28. Loop4: Loop5: Loop6: end
29. Loop7: For each cell input node X1 and transition direction D1.
30. Loop8: For each CCC output node Y2 and transition direction D2.
31. *Determine feasible vectors for minimum-pulse-width measurements on (X1,D1) measured at Y2.
32. Use logic simulation to determine vectors for which Y2 transitions when X1 transitions in direction D1 and then transitions in the opposite direction. Discard all others.
33. For each remaining vector, use SPICE simulation to determine the minimum (X1,D1) to (X1,opposite D1) delay for which (Y3,D3) occurs.
34. Save simulation results in association with (X1,D1) and the associated vector.
35. Loop7: Loop8: end
36. Read saved simulation results and write the Liberty model for the cell.

Group Nodes and Devices into CCCs

1. CCCs={ }
2. Let S1={all cell nodes}
3. Loop1: while S1< >{ }
4. Select node N from S1
5. Create new CCC, C, and add to CCCs
6. Let S2={N}
7. Add N to C
8. Loop2: while S2< >{ }
9. Select node N from S2
10. Remove N from S1
11. Remove N from S2
12. Loop3: for each transistor T such that N=source(T) or N=drain(T)
13. If source(T) not in C then add to S2
14. If drain(T) not in C then add to S2
15. Add T, source(T), and drain(T) to C
16. Loop3: end
17. Loop2: end
18. Loop1: end
19. Return CCCs CCC determination in this example is simply a depth-first search of the graph of nodes connected by transistor source-to-drain connections.

Determine the CCC Characteristic Function for Each CCC Output

1. Loop1: for each CCC output N
2. traceFunction(c0, d0, c1, d1, N, { })
3. Let CCC characteristic function of N be (c0+d0)*(c1+d1)
4. Loop1: end Routine traceFunction(c0, d0, c1, d1, N, Visited)

1. Let "connected" functions c0=c1=0
2. Let "disconnected" functions d0=d1=1
3. If N is vdd, let c1=1, d1=0, and return
4. If N is ground, let c0=1, d0=0 and return
5. If N is cell input, let c0=d1=(N=0), d0=c1=(N=1), and return
6. If N in visited, return
7. Let g=1 (legal input combination function)
8. Loop1: for each transistor T for which N=source(T) or N=drain(T)
9. Let G=gate(T)
10. Let g1=1 (transistor may be on function)
11. Let g0=0 (transistor always off function)
12. If G is vdd and T is nmos, let g1=0, g0=1
13. If G is ground and T is pmos, let g1=0, g0=1
14. If G is not vdd and not ground and T is nmos, let g1=(G=x+G=1), g0=(G=0)

15. If G is not vdd and not ground and T is pmos, let g1=(G=x+G=0), g0=(G=1)
16. If N=source(T) let N2=drain(T) otherwise let N2=source(T)
17. traceFunction(cc0, dd0, cc1, dd1, N2, visited+{N})
18. Let c0=c0+cc0*g1
19. Let d0=d0*(g0+g1*dd0)
20. Let c1=c1+cc1*g1
21. Let d1=d1+(g0+g1*dd1)
22. Let g=g*(g0+g1)
23. Loop1: end
24. Let c0=c0*g
25. Let c1=c1*g
26. Cond1: If N is a CCC output
27. Let c0=c0*(N=0+N=x)
28. Let d0=d0*(N=1+N=z)
29. Let c1=c1*(N=1+N=x)
30. Let d1=d1*(N=0+N=z)
31. Cond1: end The routine traceFunction executes a depth-first transversal of the CCC, producing four intermediate functions at each level of the tree. The four intermediate functions are connected to 0 (c0), connected to 1 (c1), disconnected from 0 (d0) and disconnected from 1 (d1). The reason for separately handling connected and disconnected conditions is that the following inequality may occur: d0+c0< >1 or d0*c0< >0 because of the indeterminate cases when G=X or G=Z. Those cases will eventually be resolved, but the distinction is maintained for the CCC function. The final function is a function of the gate nodes encountered during traversal and the output nodes added in block Cond1.

Determine the Local Characteristic Function for Each CCC Output
1. Loop1: for each CCC output node N
2. Let the local characteristic function for N=ffull(N, { })
3. Loop1: end Routine ffull(N, visited)
1. If N in visited, return (N=0+N=1)
2. Let f=CCC characteristic function of N
3. Loop1: for each node N2 which is a CCC input to the CCC of which N is output
4. Let g=forall(f, N2)
5. If f< >g then let f=g+f*ffull(N2, visited+{N})
6. Loop1: end
7. Return f The local characteristic function is determined by tracing back from the CCC function f through the nodes N2 which f depends on. The part of the function which does not depend on N2, if any, is retained as is. This prevents the entanglement of the functions for nodes which may never be simultaneously connected. For instance, a one-hot mux might have the function (S=0*SN=1)*(A=0*Y=0+A=1*Y=1)+(S=1*SN=0)*(B=0*Y=0+B=1*Y=1), but if the A and B branches were not kept separate, the result would be (S=0*SN=1)*(A=0*Y=0+A=1*Y=1)*(B=0+B=1)+(S=1*SN=0)*(B=0*Y=0+B=1*Y=1)*(A=0+A=1), which contains twice the number of terms. For cases with more than two alternatives or for which the inputs are more complex functions, the number of terms would increase by a power of 2 or worse, rather than increasing linearly in the number of inputs.

Determine Feasible Vectors for Each Leakage State
1. Read user-specified partial function set F for leakage measurements.
2. If F is empty, let F={1}, i.e. a single, universal function
3. Return completeVector(F)

Leakage power is a global measure on the cell, so there is no way of localizing the vector selection. However, selection of a single complete vector is still a problem for larger cells. The completeVector routine described below allows incremental determination of a vector for which all node settings are compatible with the global characteristic function of the cell by building up the vector from local characteristic functions.

Determine Feasible Vectors for Hidden Measurements on (X1, D1)
1. Read user-specified function set F for hidden measurements from (X1, D1).
2. If F is empty, let F={1}, i.e. a single, universal function
3. Let vector set L={ }
4. Loop1: for each function f in F
5. Let function g=hiddenAtOutputs(f, {all cell output nodes})
6. Let L=L+completeVector(g)
7. Loop1: end
8. Return L Routine hiddenAtOutputs(f, Y)
1. If Y={ } then return {f}
2. Choose node y from Y
3. Let Y2 be Y with y removed
4. Let g be the local characteristic function of y
5. Let h=forall(f*g, X1), i.e. those terms of g which do not depend on X1
6. Let H=hiddenAtOutputs(h, Y2)
7. If H< >{ } then return H
8. Let h1=g*~h, i.e. those terms of g which depend on X1
9. Let H1=enumerateIndep(h1, X1)
10. Loop1: for each function h2 in H1
11. Let k=fback(h1*g)*(D1 rise ? X1=0: X1=1)
12. Let K=enumerate(k)
13. Loop2: for each function k1 in K
14. Use logic simulation on partial vector represented by k1.
15. Cond1: if y does not switch
16. L=hiddenAtOutputs(k1, Y2)
17. If L< >{ } then return L
18. Cond1: end
19. Loop2: end
20. Loop1: end
21. Return { }

Hidden power is also a cell-global measurement. Vectors used to measure hidden power must be compatible with the global cell function, and must also not transition any cell output node. A search is conducted for a vector which is built up incrementally by considering each cell output. If the input node is disconnected from the output then it is known to be hidden. If there is no disconnected state which is compatible with hidden power at the other outputs, then connected cases must be considered. The connected vectors are determined in much the same manner as for delay arcs (below), but each partial vector is tested by logic simulation to find one for which the output does not transition. Other outputs are not examined because they may depend on node settings not yet determined.

Determine Feasible Vectors for the Delay Arc from (X1, D1) to (Y2, D2)
1. Let f be the local characteristic function of Y2.
2. Let g=f*~forall(f, X1), i.e. that portion of f which depends on X1.
3. Let function set H=enumerateIndep(g, X1), i.e. one element for each combination of those input nodes of g1 whose local characteristic function does not depend on X1.

4. Let vector set L={ }
5. Loop1: for each function h in H
6. Let k=fback(f*h)*(D1 rise ? X1=0: X1=1)*(D2 rise ? Y1=0: Y1=1)
7. Let K=enumerate(k)
8. Let L=L+completeVector(K)
9. Loop1: end
10. Return L A delay arc indicates an event where an input transition causes an output transition. The feasible vectors should contain all nodes which transition during the event or which control whether the transition can propagate, or which can control the propagation speed or power. The input transition may cause transitions at nodes which are inputs to the local function of the output node but which are disconnected initially and may not directly affect the function. The inputs on which such input node transition depends must also be considered, in addition to the nodes on which the output depends directly. In short, the purpose of the fback routine is to include nodes which are connected in the final state but not the initial state, and to include those nodes' dependencies in the initial state.

The enumerateIndep routine enumerates over combinations of nodes which do not depend on the input X1. The fback routine combines the entire function f with the relevant input node functions h—it doesn't combine only with those terms of f for which the input is connected. This can have the result of combining input node functions which are actually permanently disconnected for some cases. This could be problematic if the size of H is large. An example of this is a set of latches feeding into an address decoder. The output of the decoder will only depend on one of the latches, as determined by the address inputs. By considering each of the address input combinations separately, each combined function k only includes the relevant input latch functions and not the cross-product of all latch functions.

The enumerate routine considers all valid combinations of 0/1 settings of those nodes which function k depends on.

Determine Feasible Vectors for Constraints Between (X1, D1) and (X2, D2) Measured at (Y3, D3)
1. Let f1 be the local characteristic function of Y3.
2. Let vector set L={ }
3. Let g1=f1*~forall(f1, {X1, X2}), i.e. that portion of f which depends on X1 or X2 or both.
4. Let function set H1=enumerateIndep(g1, {X1, X2}), i.e. one element for each combination of those input nodes of g1 whose local characteristic function does not depend on X1 or X2.
5. Loop1: for each function h1 in H1
6. Let f2=fback(f1*h1)
7. Let g2=f2*~forall(f2, {X1, X2})
8. Let function set H2=enumerateIndep(g2, {X1, X2})
9. Loop2: for each function h2 in H2
10. Let k=fback(f2*h2)*(D1 rise ? X1=0: X1=1)*(D2 rise ? X2=0: X2=1)*(D3 rise ? Y3=0: Y3=1)
11. Let K=enumerate(k)
12. Let L=L+completeVector(K)
13. Loop2: end
14. Loop1: end
15. Return L A constraint measurement finds the minimum interval between two transitions at which an output or internal node transition behaves similarly to when there is a large separating interval between inputs. The constraint vector finding routine is essentially similar to the delay arc finder. Since there are two transitions in sequence, however, fback must be called twice to include all nodes which can affect the measurement, and nodes which depend on either X1 or X2 are expanded.

Determine Feasible Vectors for Minimum-Pulse-Width Measurements on (X1,D1) Measured at (Y2, D2)
1. Use constraint routine for constraint between (X1,D1) and (X1, reverse D1) measured at (Y2, D2).

Common Routines
Routine fback(f)
1. Let g=f
2. Loop1: for all nodes N such that forall(f, N)<>f (i.e. f depends on N)
3. Let h be the local characteristic function of N
4. Let g=g*h
5. Loop 1: end
6. Return g Routine enumerateIndep(f, XX)
1. Let g=f
2. Loop1: for each node N in function f
3. Let h be the local characteristic function of N
4. If forall(h, XX)<>h, then let g=exists(g, N)
5. Loop1: end
6. Return enumerate(g)

Routine enumerate(f)
1. Return enumeratePart(f, 0, 1, {all nodes})

Routine enumeratePart(f, fskip, g, NN)
1. If f*~fskip=0, then return { }
2. If f=1 or NN={ }, then return {f*g}
3. Choose node N from NN.
4. Let f1=forall(f, N)
5. If f==f1, then return enumeratePart(f, fskip, g, NN-{N})
6. Let function set C=enumeratePart(f2, fskip, g, NN-{N})
7. Let fskip=fskip+union(C)
8. Let function set A=enumeratePart(cofactor(f, N=0), cofactor(fskip, N=0), g*(N=0), NN-{N})
9. Let function set B=enumeratePart(cofactor(f, N=1), cofactor(fskip, N=1), g*(N=1), NN-{N})
10. Return A+B+C Routine completeVector(F)
1. Let vector set V={ }
2. Loop1: for each function f in F
3. V=V+satAll(f, {all nodes ordered input to output})
4. Loop1: end
5. Return V Routine satAll(f, NN)
1. If f=0, return { }
2. If NN={ }, return {f}
3. Let N be the first node from NN
4. Let g be the local characteristic function of N.
5. Let f=f*g
6. Let f=f+cofactor(f, N=z)+cofactor(f, N=x)
7. Let A=satAll(f*(N=1), NN-{N})
8. If A<>{ } return A
9. Let B=satAll(NN=0), NN-{N})
10. Return B Although satAll is exponential in theory, it is called in such a way that it is linear in practice. Each local characteristic function contains all input nodes which are relevant to the output. By ordering the nodes from input to output via a depth-first traversal of CCCs, each node considered is either already determined by an output or previously set input. Otherwise, each considered node will determine the value of an output that has yet to be constrained. If the latter, then any 0/1 value will produce some valid setting on the unconstrained outputs.

Logic Function Routines

These are low-level routines operating on logic functions and implemented in the BDD package.

Routine forall(f, XX)
1. Let g=f
2. Loop1: for each N in XX
3. Let g=cofactor(g, N=0)*cofactor(g, N=1)*cofactor(g, N=z)*cofactor(g, N=x)
4. Loop1: end
5. Return g Routine exists(f, XX)
1. Let g=f
2. Loop1: for each N in XX
3. Let g=cofactor(g, N=0)+cofactor(g, N=1)+cofactor(g, N=z)+cofactor(g,N=x)
4. Loop1: end
5. Return g Routine cofactor(f, g)
1. Assume g is a product term. Return h such that h*g=f*g and h does not refer to a node in g.

Although this invention has been described in connection with specific forms and embodiments thereof, it will be appreciated that various modifications other than those discussed above may be resorted to without departing from the spirit or scope of the invention as defined in the appended claims. For example, functionally equivalent elements or processes may be substituted for those specifically shown and described, certain features may be used independently of other features, and in certain cases, particular locations of the elements or processes may be reversed or interposed, all without departing from the spirit or scope of the invention as defined in the appended claims.

What is claimed is:

1. A circuit simulator system with computationally optimized characterization of at least one programmably implemented cell modeling an electronic circuit having multiple logic components defined by a plurality of switching devices and interconnection nodes, the circuit simulator system comprising:
   at least one processor;
   a memory storing the at least one programmably implemented cell, the cell including a netlist defining a set of nodes and electronic devices of the electronic circuit;
   a grouping module executing on said at least one processor to decompose the cell into a plurality of channel connected component (CCC) portions intercoupled along a downstream flow direction between input and output nodes of the cell, each said CCC portion having a local output node defined by one of the nodes of the cell and including at least one switching device establishing a conduction channel within a channel path extending from said local output node to a power plane of the cell;
   a function generation module coupled to said grouping module executing on said at least one processor to generate a component characteristic function for each said CCC portion, the component characteristic function logically summing a locus of vectors for nodes electrically connected to said local output node, said vectors each mapping the nodes within one said channel path of said CCC portion to one potential combination of logic values therefor;
   a function expansion module executing on said at least one processor to expand the component characteristic function of each said CCC portion to form a local characteristic function with respect to one or more other CCC portions disposed upstream therefrom, said function expansion module combining with the component characteristic function of said upstream CCC portion at least one vector of said CCC portion containing said local output node of said upstream CCC portion, said local characteristic function excluding any upstream local output node electrically disconnected from said local output node thereof;
   a vector determination module executing on said at least one processor on said local characteristic functions to generate at least one feasible vector according to requirements predefined for a parametric measurement, each said feasible vector defining a combination of interrelated node logic levels, each feasible vector representing at least one electrically relevant wire; and,
   a simulation portion executing on said at least one processor to generate simulated analysis of the parametric measurement according to the at least one feasible vector, nonfeasible vectors being excluded from the simulated analysis, the cell being characterized responsive to the simulated analysis, the characterized cell thereafter being configured to guide placement and routing physically laying out the modelled electronic circuit, electrically relevant wires being routed according to the simulated analysis.

2. The circuit simulator system as recited in claim 1, wherein said local output node of each said CCC portion is connected to one of: a control terminal of a switching device in a downstream CCC portion and an output terminal of the cell.

3. The circuit simulator system as recited in claim 2, wherein said function expansion module executes a logical AND operation in combining the vectors of said CCC portion and the component characteristic function of said upstream CCC portion.

4. The circuit simulator system as recited in claim 2, wherein said function expansion module executes to iteratively expand said component characteristic function of each CCC portion in turn with respect to each remaining upstream CCC portion having a local output node represented in at least one vector of said CCC portion.

5. The circuit simulator system as recited in claim 2, wherein each of the local characteristic functions defines a portion of a binary decision diagram (BDD) for the cell, each node of the cell included in each local characteristic function being electrically connected to said local output node of the corresponding CCC portion, each node being represented with a logic value selected from the group consisting of: 0, 1, Z, and X;
   where Z represents a logically floating condition, and X represents a logically conflicted condition.

6. The circuit simulator system as recited in claim 2, wherein the cell is defined by a netlist establishing a predefined set of nodes and electronic devices including a plurality of transistor devices.

7. The circuit simulator system as recited in claim 6, further comprising a first simulation module executing a logic simulation on the cell according to each feasible vector to selectively confirm compatibility with the parametric measurement.

8. The circuit simulator system as recited in claim 7, further comprising a second simulation module executing a transistor level simulation on the cell according to a measurement vector to determine a value for the parametric measurement.

9. The circuit simulator system as recited in claim 8, wherein said vector determination module executes to generate at least one said feasible vector for a plurality of parametric measurements including: a leakage state measurement, a hidden power measurement, a delay arc measurement, a constraint measurement between preselected nodes, a minimum pulse width measurement.

10. A circuit simulator and assembly system with reduced processing time in characterizing a programmably implemented cell modeling an electronic circuit having multiple logic components defined by a plurality of switching devices and interconnection nodes, the system comprising:
   at least one processor;
   a memory storing the at least one programmably implemented cell, the cell including a netlist defining a set of nodes and electronic devices of the electronic circuit;
   a grouping module executing on said at least one processor to decompose the cell into a plurality of channel connected component (CCC) portions intercoupled along a downstream flow direction between input and output nodes of the cell, each said CCC portion including:
      a local output node defined by one of the nodes of the cell, said local output node of each said CCC portion being connected to one of: a control terminal of a switching device in a downstream CCC portion and an output terminal of the cell; and,
      at least one switching device establishing a conduction channel within a channel path extending from said local output node to a power plane of the cell;
   a function generation module coupled to said grouping module executing on said at least one processor to generate a component characteristic function for each said CCC portion, the component characteristic function combining by a logical OR a locus of all vectors for nodes electrically connected to said local output node, said vectors each mapping the nodes within one said channel path of said CCC portion to one potential set of logic values therefor combined by a logical AND;
   a function expansion module executing on said at least one processor to iteratively expand the component characteristic function of each CCC portion in turn with respect to each successively upstream CCC portion having a local output node represented in at least one vector of said CCC portion, at least one vector of said CCC portion containing said local output node of said upstream CCC portion being combined with the component characteristic function of said upstream CCC portion, said function expansion module thereby forming for each said CCC portion a local characteristic function precluding any extraneous vector containing an upstream local output node electrically disconnected from said local output node thereof;
   a vector determination module executing on said at least one processor on said local characteristic functions to generate a plurality of feasible vectors according to requirements predefined for a parametric measurement, said feasible vectors collectively defining all combinations of interrelated node logic levels, each feasible vector representing at least one electrically relevant wire;
   a simulation portion executing on said at least one processor to generate simulated analysis of the parametric measurement according to the plurality of feasible vectors, nonfeasible vectors being excluded from the simulated analysis, the cell being characterized responsive to the simulated analysis; and
   a circuit assembly portion physically laying out the modelled electronic circuit according to the cell after characterization, electrically relevant wires being routed according to the simulated analysis.

11. The system as recited in claim 10, wherein each of the local characteristic functions defines a portion of a binary decision diagram (BDD) for the cell, each node of the cell included in each local characteristic function being electrically connected to said local output node of the corresponding CCC portion, each node being represented with a logic value selected from the group consisting of: 0, 1, Z, and X; where Z represents a logically floating condition, and X represents a logically conflicted condition.

12. The system as recited in claim 11, wherein said vector determination module executes to generate the feasible vectors for a plurality of parametric measurements including: a leakage state measurement, a hidden power measurement, a delay arc measurement, a constraint measurement between preselected nodes, a minimum pulse width measurement.

13. The system as recited in claim 12, further comprising:
   a first simulation module executing a logic simulation on the cell according to the feasible vectors to selectively identify therefrom at least one measurement vector having confirmed compatibility with the parametric measurement; and,
   a second simulation module executing a transistor level simulation on the cell according to the measurement vector to determine a value for the parametric measurement.

14. A method for reducing processing time in simulating at least one programmably implemented cell modeling an electronic circuit having multiple logic components defined by a plurality of switching devices and interconnection nodes, the method executed in at least one processor comprising:
   forming the at least one programmably implemented cell to include a netlist defining a set of nodes and electronic devices of the electronic circuit;
   decomposing the cell into a plurality of channel connected component (CCC) portions intercoupled along a downstream flow direction between input and output nodes of the cell, each said CCC portion having a local output node defined by one of the nodes of the cell and including at least one switching device establishing a conduction channel within a channel path extending from said local output node to a power plane of the cell;
   generating a component characteristic function for each said CCC portion, the component characteristic function logically summing a locus of vectors for nodes electrically connected to said local output node, said vectors each mapping the nodes within one said channel path of said CCC portion to one potential combination of logic values therefor;
   expanding the component characteristic function of each said CCC portion to form a local characteristic function with respect to one or more other CCC portions disposed upstream therefrom, the function expansion including combining with the component characteristic function of said upstream CCC portion at least one vector of said CCC portion containing said local output node of said upstream CCC portion, whereby said local characteristic function excluding any upstream local output node electrically disconnected from said local output node thereof;
   generating from said local characteristic functions at least one feasible vector according to requirements predefined for a parametric measurement, each said feasible vector defining a combination of interrelated node logic levels, each feasible vector representing at least one electrically relevant wire; and, executing a simulation portion to generate simulated analysis of the parametric measurement according to the at least one feasible vector, nonfeasible vectors being excluded from the simulated analysis, the cell being characterized responsive to the simulated analysis, the characterized cell thereafter being configured to guide placement and routing for physically laying out the modelled electronic circuit, electrically relevant wires being routed according to the simulated analysis.

15. The method as recited in claim 14, wherein said local output node of each said CCC portion is selected from a node of the cell connected to one of: a control terminal of a switching device in a downstream CCC portion and an output terminal of the cell.

16. The method as recited in claim 15, wherein:

a logical AND operation is executed in combining the vectors of said CCC portion and the component characteristic function of said upstream CCC portion; and, said component characteristic function of each CCC portion is iteratively expanded in turn with respect to each remaining upstream CCC portion having a local output node represented in at least one vector of said CCC portion.

17. The method as recited in claim 16, wherein each of the local characteristic functions defines a portion of a binary decision diagram (BDD) for the cell, each node of the cell included in each local characteristic function being electrically connected to said local output node of the corresponding CCC portion, each node being represented with a logic value selected from the group consisting of: 0, 1, Z, and X;

where Z represents a logically floating condition, and X represents a logically conflicted condition.

18. The method as recited in claim 16, further comprising:

executing a logic simulation on the cell according to each feasible vector to selectively confirm compatibility with the parametric measurement; and, executing a switching device level simulation on the cell according to a measurement vector to determine a value for the parametric measurement.

19. The method as recited in claim 18, wherein at least one said feasible vector is generated for a plurality of parametric measurements including: a leakage state measurement, a hidden power measurement, a delay arc measurement, a constraint measurement between preselected nodes, a minimum pulse width measurement.

20. The method as recited in claim 18, wherein a predetermined processing time parameter is minimized by precluding from each said feasible vector any local output node electrically disconnected during execution of the parametric measurement.

* * * * *